(12) United States Patent
Sarin

(10) Patent No.: US 7,944,755 B2
(45) Date of Patent: May 17, 2011

(54) ERASE VERIFY IN MEMORY DEVICES

(75) Inventor: Vishal Sarin, Cupertino, CA (US)

(73) Assignee: Micron Technology, Inc., Boise, ID (US)

(*) Notice: Subject to any disclaimer, the term of this patent is extended or adjusted under 35 U.S.C. 154(b) by 140 days.

(21) Appl. No.: 12/366,216

(22) Filed: Feb. 5, 2009

(65) Prior Publication Data
US 2010/0195403 A1 Aug. 5, 2010

(51) Int. Cl.
*G11C 16/06* (2006.01)
(52) U.S. Cl. ......... 365/185.22; 365/185.03; 365/185.11; 365/185.17; 365/185.18; 365/185.29
(58) Field of Classification Search ............. 365/185.03, 365/185.11, 185.17, 185.18, 185.22, 185.29
See application file for complete search history.

(56) References Cited

U.S. PATENT DOCUMENTS

| | | | |
|---|---|---|---|
| 6,219,280 B1* | 4/2001 | Naganawa | 365/185.22 |
| 2008/0002468 A1* | 1/2008 | Hemink | 365/185.17 |
| 2008/0013390 A1* | 1/2008 | Zipprich-Rasch | 365/201 |

* cited by examiner

*Primary Examiner* — Hoai V Ho
(74) *Attorney, Agent, or Firm* — Leffert Jay & Polglaze, P.A.

(57) ABSTRACT

In one or more embodiments, methods for erasing memory devices, and a memory system are disclosed, one such method comprising determining which cells of a sample are not erased, either directly or indirectly. The number of unerased cells in the sample can be compared to a threshold. An erase operation can be performed on the memory block responsive to the comparison until the number of unerased cells is less than the threshold.

24 Claims, 4 Drawing Sheets

there is a need in the art for an improved method for verifying an erased state of a memory cell.

ERASE VERIFY IN MEMORY DEVICES

TECHNICAL FIELD OF THE INVENTION

The present disclosure relates generally to semiconductor memory and more particularly to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and non-volatile/flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Each cell in a non-volatile memory device can be erased and programmed. For example, memory cells can be programmed as a single bit per cell (e.g., as in the case with a single level cell—SLC) or multiple bits per cell (e.g., as in the case with a multilevel cell—MLC). Each cell's threshold voltage ($V_{th}$) determines the data that is stored in the cell. For example, in an SLC, a $V_{th}$ of 0.5V might indicate a programmed cell while a $V_{th}$ of −0.5V might indicate an erased cell. MLC devices can have multiple threshold voltages representing multiple programmed states.

Once a memory cell goes through an erase operation, it is erase verified. The purpose of the erase verify operation is to determine that the cell's $V_{th}$ is below a maximum voltage level (e.g., −1V). The typical method for performing an erase verify is to apply an erase verify voltage (e.g., 0V) as $V_{w1}$ to all of the memory cell control gates of a series string of memory cells. This is typically accomplished by substantially simultaneously biasing all of the access lines (e.g., word lines) of a series string. A $V_{th}$ of the series string is then measured and compared to a reference $V_{th}$.

The typical prior art erase verification provides an "average" threshold voltage of all of the memory cells in the series string of memory cells being measured. It is possible that one or more of the memory cells undergoing the erase verification has a $V_{th}$ that is more positive than the reference threshold. Thus, the series string might pass the verification process and still have a memory cell that is not completely erased. For example, one or more memory cells could have a $V_{th}$ of −1.3V instead of the target −2V that indicates erasure.

In order to accommodate the possible variations in erase verification, larger erase margins are used during verification. In other words, a range of voltages is used during verification instead of one voltage. Thus, if a memory device is erased to a voltage within a certain voltage range, it is considered erased. In an MLC device, this has the drawback of using larger portions of the limited voltage range that can be assigned to different states of the memory device.

For the reasons stated above, and for other reasons stated below which will become apparent to those skilled in the art upon reading and understanding the present specification,

DETAILED DESCRIPTION

Figure 1:
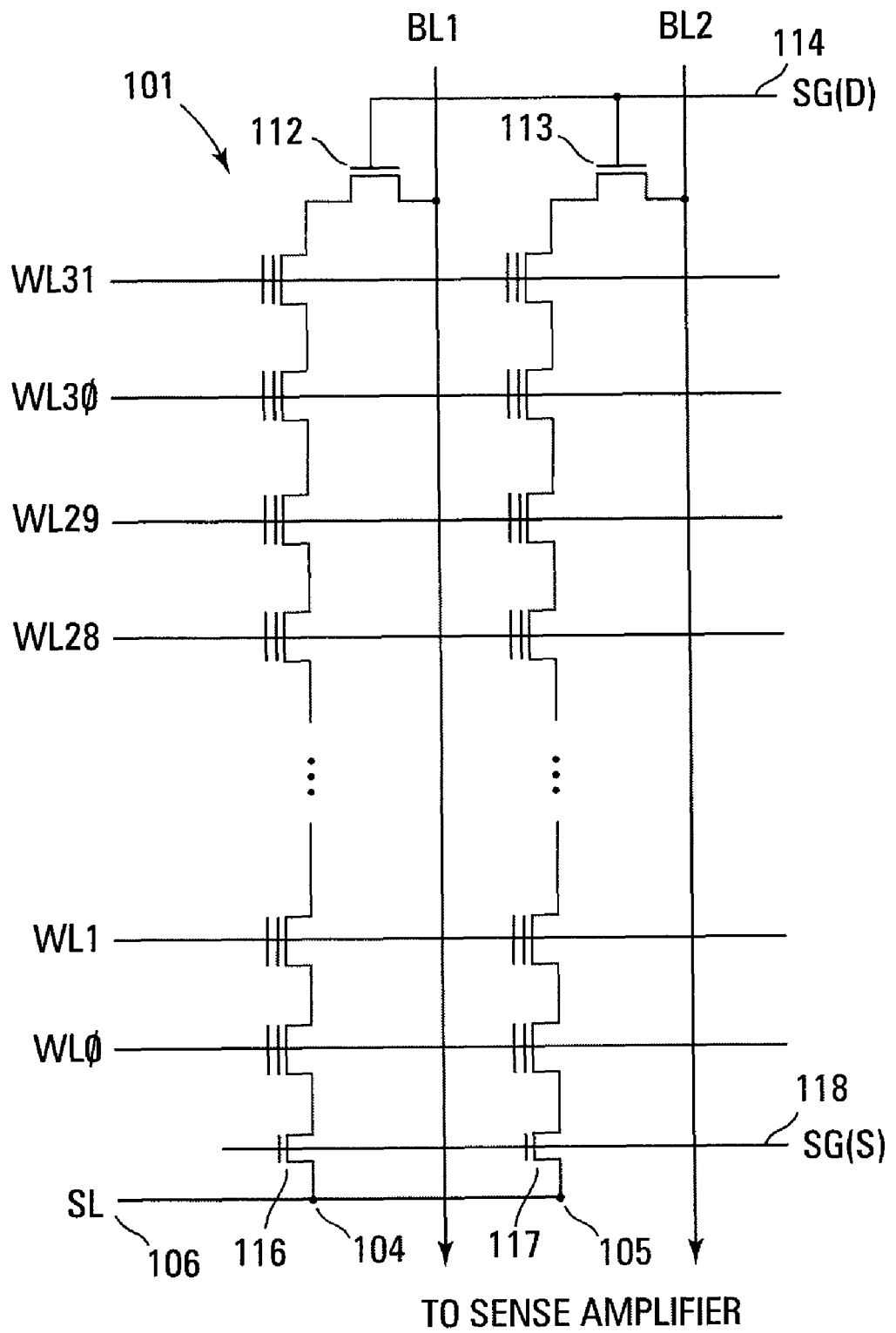
FIG. 1 shows schematic diagram of one embodiment of a portion of a non-volatile memory array.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a schematic diagram of a portion of a NAND architecture memory array comprising series strings of non-volatile memory cells on which the embodiments of the subsequently discussed erase and erase verify operations can operate. While the subsequent discussions refer to a NAND memory device, the present embodiments are not limited to such an architecture but can be used in other memory device architectures as well. For example, alternate embodiment arrays could be organized in NOR or AND architectures.

The memory array is comprised of an array of non-volatile memory cells 101 (e.g., floating gate) arranged in columns such as series strings 104, 105. Each of the cells 101 is coupled drain to source in each series string 104, 105. An access line (e.g., word line) WL0-WL31 that spans across multiple series strings 104, 105 is connected to the control gates of each memory cell in a row in order to bias the control gates of the memory cells in the row. The data lines (e.g., bit lines) BL1, BL2 are eventually connected to sense amplifiers (not shown) that detect the state of each cell by sensing current on a particular bit line. Even though 32 word lines are shown in FIG. 1, alternate embodiments are not limited to any certain quantity of word lines.

Each series string 104, 105 of memory cells is coupled to a source line 106 by a source select gate transistor 116, 117 and to an individual bit line BL1, BL2 by a drain select gate transistor 112, 113. The source select gate transistors 116, 117 are controlled by a source select gate control line SG(S) 118 coupled to their control gates. The drain select gate transistors 112, 113 are controlled by a drain select gate control line SG(D) 114.

The memory array can be organized as memory blocks. The quantity of memory blocks is typically determined by the size of the memory device (i.e., 512 MB, 1 GB). In one embodiment, each memory block programmed in an SLC manner is comprised of 64 pages. In another embodiment, a memory block programmed in an MLC manner is comprised of 128 pages. Each page can be comprised of 2048 bytes of data on 32 word lines. The present embodiments are not limited to any one size of memory block.

Figure 2:
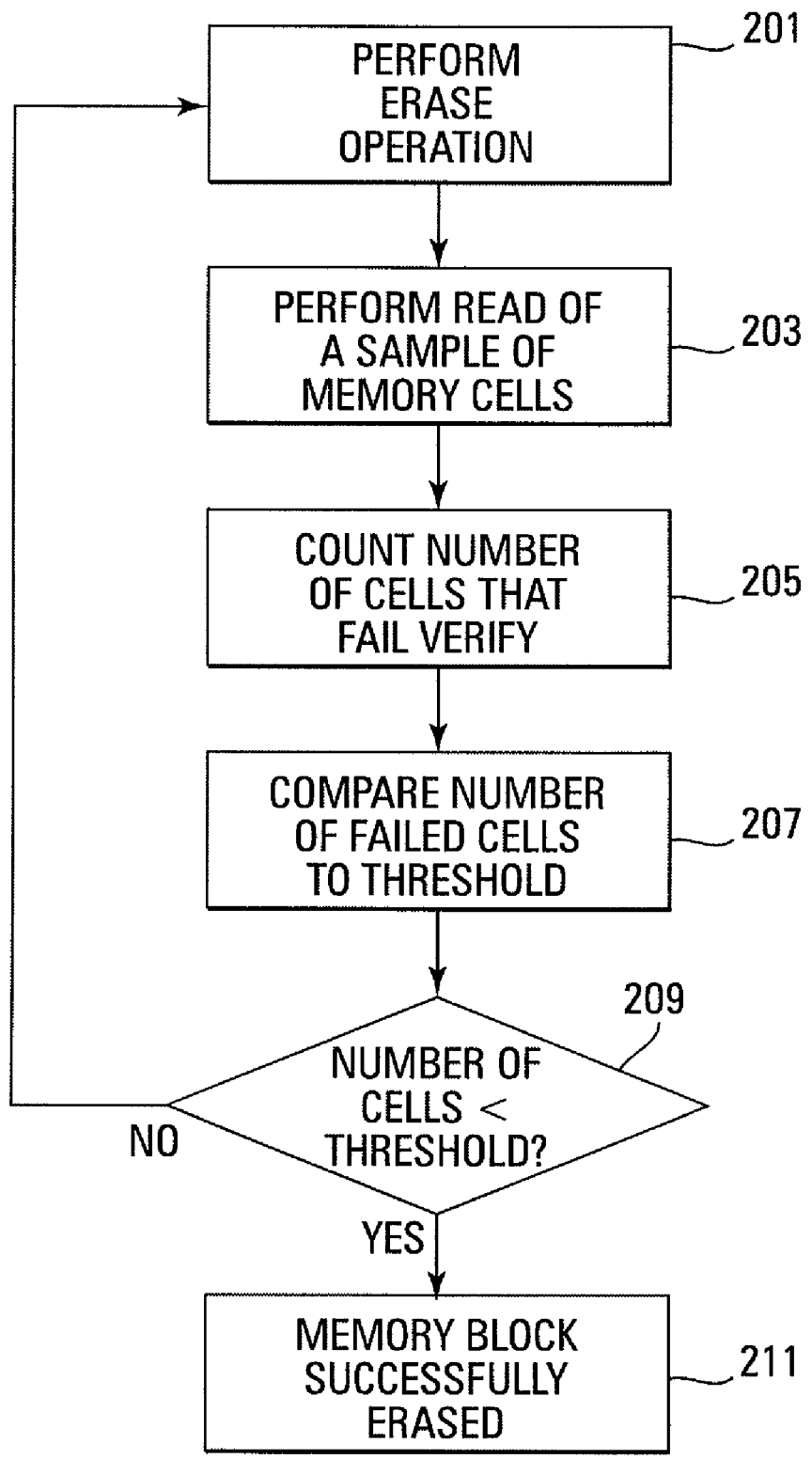
FIG. 2 shows a flowchart of one embodiment of a method for performing an erase verify operation.

FIG. 2 illustrates a flowchart of one embodiment of a method for performing an erase verify operation that includes a prior erase operation. Such an operation is typically performed on an entire memory block or other grouping of memory cells. However, the present embodiments are not limited to erasing and erase verifying any predetermined quantity of memory cells.

When an erase operation is performed 201, the word lines for the memory cells/block are biased with an erase voltage for example. This biases the control gates of each memory cell coupled to the biased word line with the erase voltage. In one embodiment, the erase voltage is approximately 0V. The drain and source connections of the bit lines that are coupled to the memory cells being erased are all left floating as are the source line, select gate drain transistors, and the select gate source transistors. Alternate embodiments can use other erase voltages.

Figure 3:
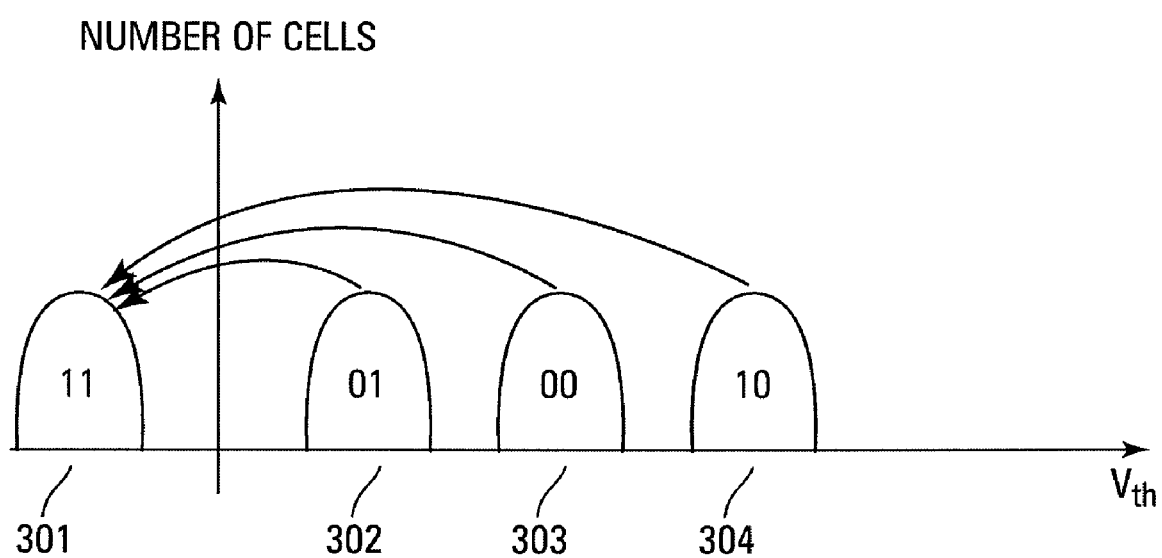
FIG. 3 shows one embodiment of the movement of a $V_{th}$ distribution for an erase operation on a group of memory cells in accordance with the method of FIG. 2.

An erase operation moves a programmed memory cell's threshold voltage from a programmed level to an erased level. One embodiment of such a threshold voltage movement is illustrated in FIG. 3 and discussed subsequently.

A read operation is then performed on a statistical sample of the memory cells 203 to determine, in an analog embodiment, a threshold voltage of each memory cell. In a digital embodiment, the read operation determines if the stored data value of each cell is the logical erased state (e.g., logical 11).

If a memory block is being erased, the sample might include the odd and/or even pages on the edges of the memory block (i.e., WL0, WL1 and/or WL30, WL31). In another embodiment, the sample could include the odd and/or even pages of word lines in the middle of the memory block (i.e., WL15, WL16). The quantity of memory cells chosen for the sample is not important since it is only desirable to obtain a statistical sampling of the memory cells being erased. Such a sample might only be a single page, odd or even, of the memory block or multiple pages.

The reading of memory cells can be accomplished by applying an appropriate read voltage to the control gates and the drain of the selected cell. The bit line current, that can indicate the threshold voltage of the cell, is compared to a reference current by the sense circuitry to determine the state of the memory cell.

In one example of an erase verify operation on memory cells programmed to 2 bits/cell (i.e., 4 levels), 0V is applied to a selected word line (e.g., to the control gate of a cell or cells in the selected word line). The bit line is biased at less than 1.0V (e.g., approximately 0.8V) while the source line is at ground potential.

The quantity (e.g., count or percentage) of cells that fail the erase verify operation is then determined 205, either directly or indirectly (such as where a quantity of cells that pass the erase verify operation is determined. In an embodiment where the quantity is a cell failure count, the cell failure count is compared to a failure threshold value 207. The failure threshold value can be an absolute number of failures or a percentage of failures and can be read from a register or other memory location dedicated for storing the threshold value.

The failure threshold value can be the maximum statistical number of failures that are correctable by coding techniques such as Trellis coded modulation (TCM) or low density parity check (LDPC). The failure threshold value for memory cell failures, in one embodiment, is determined by characterization of the memory device fabrication technology and/or by experimentation. For example, different fabrication technologies used for the charge storage function (e.g., nitride, polysilicon) could yield different failure threshold values.

If the quantity of cells that failed the erase verify operation is less than the failure threshold value 209, (or other comparison of the determined quantity to the threshold value in other embodiments, the memory block is considered to be successfully erased 211. If the quantity of cells that failed the erase verify operation is greater than or equal to the failure threshold value 209, the erase operation 201 and the erase verify operation 203, 205, 207, 209 are repeated until the quantity of failed cells is less than the failure threshold value or the block is flagged as not being erasable. In another embodiment, if the quantity of cells that failed the erase verify operation is less than or equal to the failure threshold value, the memory block is considered to be successfully erased.

In an alternate embodiment, instead of directly determining a quantity of cells that failed the verification operation, a quantity of cells that passed the verification is determined and compared against a passing threshold value. For example, in one such embodiment, if the quantity of memory cells that passed the verification is equal to or greater than the passing threshold, the erase verification is successful, indicating that the memory cells have been erased. Failure to meet the passing threshold results in a repeat of the erase operation 201 and the erase verification operation 203, 205, 207, 209.

FIG. 3 illustrates one embodiment of the movement of a $V_{th}$ distribution for an erase operation on a memory block, or other group of memory cells, in accordance with the method of FIG. 2. This distribution assumes that programmed states have positive threshold voltages and an erased state has a negative threshold voltage.

The illustrated $V_{th}$ distributions are for an MLC device having two bits of data for each distribution. For example, the erased state is a logical 11 301, the first programmed state is a logical 01 302, the next programmed state is a logical 00 303, and the most positive programmed state is a logical 10 304. Alternate embodiments can use other bit quantities for each distribution and/or assign different logical values to each programmed level.

Each time a memory cell experiences an erase pulse, it moves in the negative direction. After a successful erase operation, the erase verify operation indicates that the memory cell or cells being erased have a negative threshold voltage that is within the erased threshold distribution 301 shown.

Figure 4:
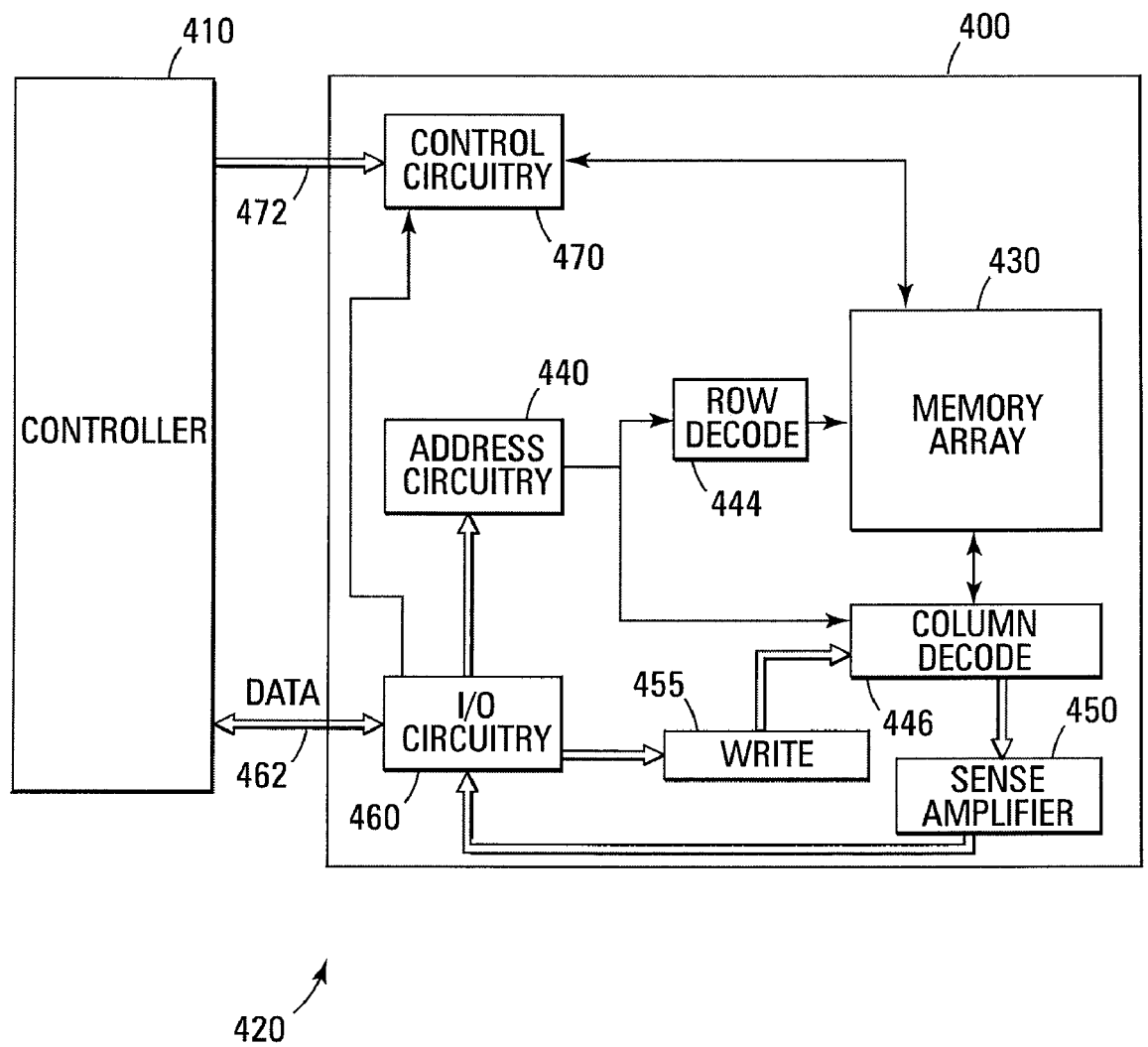
FIG. 4 shows a block diagram of one embodiment of a memory system incorporating the method for program window adjustment of the present disclosure.

FIG. 4 illustrates a functional block diagram of a memory system 420 that includes a memory device 400. The memory device 400 has been simplified to focus on features of the memory that are helpful in understanding the present embodiments for erase verification. The memory device 400 is coupled to a system controller 410. The controller 410 may be a microprocessor or some other type of controller.

The memory device 400 includes an array 430 of non-volatile memory cells, such as the series strings illustrated in FIG. 1 and discussed previously. The memory array 430 is arranged in banks of word line rows and bit line columns wherein the control gates of the memory cells are coupled to the word lines and the drain and source regions of the memory cells are coupled to the bit lines. In one embodiment, the columns of the memory array 430 are comprised of series strings of memory cells. As is well known in the art, the connections of the memory cells to the bit lines determines whether the array is a NAND architecture, an AND architecture, or a NOR architecture.

Address buffer circuitry 440 is provided to latch address signals provided through the I/O circuitry 460. Address signals are received and decoded by a row decoder 444 and a column decoder 446 to access the memory array 430. It will be appreciated by those skilled in the art, with the benefit of the present description, that the number of address input connections depends on the density and architecture of the memory array 430. That is, the number of addresses increases with both increased memory cell counts and increased bank and block counts.

The memory device 400 reads data in the memory array 430 by sensing voltage or current changes in the memory array columns using sense amplifier circuitry 450. The sense amplifier circuitry 450, in one embodiment, is coupled to read and latch a row of data from the memory array 430. I/O circuitry 460 is included for bidirectional data communication as well as address communication over a plurality of data connections 462 with the controller 410. Write circuitry 455 is provided to program data to the memory array 430.

Memory control circuitry 470 decodes signals provided on control connections 472 from the controller 410. These signals are used to control the operations on the memory array 430, including data read, data write (program), and erase operations. The memory control circuitry 470 may be a state machine, a sequencer, or some other type of control circuitry to generate the memory control signals. In one embodiment, the memory control circuitry 470 is configured to control execution of the erase and erase verify operation embodiments discussed previously. The memory control circuitry 470 is further configured to read data from the memory array 430.

The memory device illustrated in FIG. 4 has been simplified to facilitate a basic understanding of the features of the memory. A more detailed understanding of internal circuitry and functions of flash memories are known to those skilled in the art.

CONCLUSION

In summary, one or more embodiments of the present disclosure provide an erase verification operation that verifies a statistical sample of the memory cells being erased instead of a typical prior art "average" read of memory cells. If a particular subset of the sample, greater than a threshold value, is found to be unerased, another erase operation is performed. Once the number of memory cell erase failures are less than the threshold value, for example, the erase operation and erase verify operation are complete.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for erasing a group memory cells, the method comprising:
    performing an erase operation on the group of memory cells;
    determining a quantity of memory cells of a sample of the group of memory cells that are not erased, wherein the sample comprises a quantity of memory cells that is less than the group of memory cells; and
    performing an erase operation on the group of memory cells responsive to a comparison of the determined quantity and a threshold quantity.

2. The method of claim 1 wherein determining a quantity of memory cells that are not erased comprises directly determining a quantity of cells that fail an erase verify operation.

3. The method of claim 1 and further comprising generating the threshold quantity in response to the memory cell fabrication technology.

4. The method of claim 2 wherein the quantity of memory cells is a percentage of memory cells that were verified for erase.

5. The method of claim 2 wherein the quantity of memory cells is a count of memory cells that failed erase verification.

6. The method of claim 1 wherein determining the quantity of memory cells comprises determining a threshold voltage of each memory cell in the sample of the group of memory cells.

7. The method of claim 1 wherein determining the quantity of memory cells comprises determining a logical state of each memory cell.

8. A method for erasing a memory block, the method comprising:
    performing an erase operation on the memory block;
    reading each memory cell in a sample of the memory block to determine a quantity of memory cells that are not erased, wherein the sample comprises fewer memory cells than the memory block;
    comparing the quantity to a threshold quantity of memory cells; and
    repeating the erase operation on the memory block responsive to the comparison.

9. The method of claim 8 wherein repeating the erase operation comprises repeating the erase operation if the quantity is greater than or equal to the threshold quantity of memory cells.

10. The method of claim 8 wherein reading each memory cell in the sample comprises applying a verification voltage to control gates of each memory cell in the sample while a data line coupled to each memory cell in the sample is biased at a bias voltage.

11. The method of claim 10 wherein the verification voltage is one of 0V or −2V.

12. The method of claim 8 wherein the threshold is determined based on a maximum quantity of erase failures that are correctable by a coding technique.

13. The method of claim 8 wherein the sample includes odd and/or even pages of access lines on edges of the memory block.

14. The method of claim 8 wherein the sample includes odd and/or even pages in a middle of the memory block.

15. The method of claim 8 wherein determining the quantity of memory cells that are not erased comprises determining a quantity of memory cells that pass an erase verification and wherein performing the erase operation responsive to the comparison comprises:
    performing the erase operation on the plurality of memory cells if the quantity of memory cells is greater than a passing threshold.

16. The method of claim 15 wherein performing the erase operation further comprises performing the erase operation based in part on a determination of whether the cells have been flagged as not being erasable.

17. The method of claim 16 wherein performing the erase operation further comprises performing the erase operation based in part on if the quantity of memory cells is greater than a failure threshold value.

18. A semiconductor, non-volatile memory device comprising:
- an array of memory cells organized in erasable groups of memory cells; and
- control circuitry coupled to the array of memory cells and configured to control operation of the array of memory cells wherein the control circuitry is configured to perform an erase operation on the erasable groups of memory cells, verify erasure of each group of memory cells by determining an unerased quantity of memory cells within a sample of memory cells of each group of memory cells, wherein the sample comprises fewer memory cells than the group of memory cells, the control circuitry further configured to compare the unerased quantity to a failure threshold value and to control an erase operation on each group of memory cells having the unerased quantity of memory cells responsive to the comparison.

19. The memory device of claim 18 wherein the array of memory cells is organized in a NAND architecture.

20. The memory device of claim 18 wherein each group of memory cells is a memory block.

21. The memory device of claim 20 wherein the memory block is comprised of 64 pages of single level cells.

22. The memory device of claim 20 wherein the memory block is comprised of 128 pages of multiple level cells.

23. The memory device of claim 18 wherein the array of memory cells is comprised of access line rows of memory cells and erase voltages are applied to control gates of the memory cells through the each access line.

24. The memory device of claim 18 wherein the failure threshold value is stored in a memory location of the memory device.

* * * * *